United States Patent [19]
Elkhoury

[11] Patent Number: 5,805,903
[45] Date of Patent: Sep. 8, 1998

[54] PROTECTION OF COMPUTER SYSTEM AGAINST INCORRECT CARD INSERTION DURING START-UP

[75] Inventor: Bassam Elkhoury, Longmont, Colo.

[73] Assignee: Compaq Computer Corporation, Houston, Tex.

[21] Appl. No.: 651,049

[22] Filed: May 21, 1996

[51] Int. Cl.⁶ ....................................................... G06F 1/32

[52] U.S. Cl. ................... 395/750.01; 395/281; 395/282; 395/283

[58] Field of Search ..................................... 395/750, 282, 395/283, 281, 750.01, 750.05, 750.06, 750.08, 182.12, 182.22, 182.2, 185.01; 361/737

[56] References Cited

U.S. PATENT DOCUMENTS

| | | |
|---|---|---|
| 4,800,462 | 1/1989 | Zacher et al. . |
| 5,528,459 | 6/1996 | Ainsbury et al. ........................ 361/737 |
| 5,589,719 | 12/1996 | Fiset ........................................ 307/131 |

OTHER PUBLICATIONS

Augat, Inc., Datasheet for 46–8 Series/Card Edge Connector (1992).

Primary Examiner—Ayaz R. Sheikh
Assistant Examiner—Ario Etienne
Attorney, Agent, or Firm—Pravel, Hewitt, Kimball & Krieger

[57] ABSTRACT

An apparatus ensures that circuit cards of a computer system are properly oriented and fully inserted into their slots before allowing the computer system to power-up. Each card has two electrically connected key fingers on the card edge, while each slot has first and second contacts adapted to engage the two key fingers when the card is fully seated on the slot. One contact of the first slot is connected to a known voltage, while the second contact is connected to the first contact of the next slot. The second contact of the next slot is in turn connected to the first contact of the subsequent slot. Thus, upon a complete engagement of the cards onto the slots, all contacts are connected in a series arrangement. The final contact is connected to an insertion detector which turns on the computer system power supply only when the voltage of the last contact equals the known voltage, indicating that all circuit cards are fully seated on the slots. Additionally, each circuit card has a card edge with asymmetrical segments which form a mechanical key for ensuring proper orientation of the circuit card on the slot.

17 Claims, 5 Drawing Sheets

PROTECTION OF COMPUTER SYSTEM AGAINST INCORRECT CARD INSERTION DURING START-UP

BACKGROUND OF THE INVENTION

1. Field of the Invention

The present invention relates in general to a keyed circuit card, and more specifically, to an electrically keyed circuit card for ensuring correct card insertion before allowing power to be turned on.

2. Description of the Related Art

Remarkable increases in hardware price/performance ratios during the last decade caused a startling shift in both technical and office computing environments. Today's personal computers easily outran yesterday's mainframes and minicomputers in performance. The availability of such computing power precipitated the growth of ever more powerful application software. Concomitantly, sophisticated multi-tasking operating system software such as UNIX, Windows 95, or Windows NT, along with sophisticated application software, required even more powerful computer systems with fault-tolerance capabilities for enterprise computing networks. Speed and fault-tolerance capabilities are typically provided using multiple processors. As these processors used a common input/output (I/O) devices such as disk drives, tape drives, printers, and communication ports, among others, it was desirable to use a common motherboard with a mezzanine bus to accept one or more processor cards to leverage the manufacturing efficiency while providing flexibility in configuring or customizing the computer system. The separation of the processor from the I/O related motherboard allowed users to buy only what they need and to tailor the computer to the workload. For instance, power users may opt to buy multiple processor cards to enhance their processing capacity, while cost-sensitive consumers may opt to buy just one processor card. Further, the relocation of components prone to be replaced during the maintenance/upgrading process onto replaceable plug-in cards reduced the cost of repairing/up-grading the system as only a few components need to be replaced. Candidate components for such circuit boards included expensive components such as processors, cache memories or specialized components, although other components can be located on such board as well.

Typically, the printed circuit board or card was inserted into a corresponding slot, connector or socket on the motherboard during the computer configuration or repair step. The use of printed circuit boards or electronic cards presented potential problems arising from improper insertions of the cards in the slots by the user or by a maintenance crew. For example, any improperly inserted board or card can cause shorts on the power distribution lines and can result in a power surge which could destroy the power supply. Further, currents can be generated to the point of causing fires or physical damage to either the entire computer system or to the improperly inserted card. The pins of the improperly inserted printed circuit card could be damaged from arcing currents since the load on the board or card would act as a short, thus drawing a large surge of current through the first power pin to make contact.

The utilization of higher density manufacturing processes further exposed the sensitivity of the processor, memory and other circuit components to under voltage or over voltage conditions. Under or over voltage conditions of even brief duration can result in damage to such circuits. In particular, some complimentary metal oxide semiconductor (CMOS) components can enter a "latch-up" condition if the negative back bias power supply voltage is inadequate. Thus, if contact is made with the ground pins and the signal pins before the power pins are connected, the devices connected to these fingers can receive voltages at their input/output pins before power is actually applied, giving rise to latch-ups. As the current surge shock could damage certain types of electronic circuits and render the system inoperable, the rapid shutdown of the regulated power supply can prevent permanent damage to the integrated circuit components.

Yet additional reliability problems can occur when intermittent connections are made by loosely inserted circuit cards and their uncharged capacitors in slots that are powered on. A voltage glitch on the slot or connector may arise when the capacitor is charged by the in-rush of current and shorting the power and ground pins. This voltage glitch can be transmitted and appear at other cards plugged into the bus near the mis-inserted card. This can corrupt data on other cards and even cause system failure. Thus, a number of possibly fatal failures for the computer system may be traced to the existence of one or more improperly inserted printed circuit boards or cards.

SUMMARY OF THE INVENTION

An apparatus is disclosed which ensures that circuit cards of a computer system are properly oriented and fully inserted into their slots before allowing the computer system to power-up. The apparatus provides an electrical key to ensure that the cards are fully inserted into their slots before allowing the computer system to power-on. Each card has two key fingers on the card edge that are electrically connected together. Correspondingly, each slot has first and second contacts adapted to engage the two key fingers when the card is fully seated on the slot. One contact of the first slot is connected to a known voltage, while the second contact is connected to the first contact of the next slot. The second contact of the next slot is in turn connected to the first contact of the subsequent slot. Each circuit card further has an asymmetrical card edge with wide and short segments adapted for plugging into a slot with corresponding wide and short receptacles. The asymmetrical segments thus form a mechanical key for ensuring proper orientation of the circuit card on the slot.

A complete engagement of all cards onto their respective slots completes an electrical path from the fist to the last contact. The last contact is connected to an insertion detector which enables a power supply to turn-on only when the voltage of the last contact equals the known voltage, indicating that all circuit cards are firmly engaged with their respective slots. In this event, the power supply is allowed to turn on and power the rest of the computer. Conversely, if one of the cards is improperly positioned in its slot, the power supply is disabled to prevent current surges from damaging either the board or the computer system. Thus, as serious damage could arise with one or more improperly configured or inserted boards, the apparatus ensures the proper orientation and full insertion of each board into its respective slot before allowing power to be applied.

BRIEF DESCRIPTION OF THE DRAWINGS

A better understanding of the present invention can be obtained when the following detailed description of the preferred embodiment is considered in conjunction with the following drawings, in which:

FIG. 4 is a schematic electrical circuit diagram of the electrical key for enabling the computer system of FIG. 1 to be powered-on.

DETAILED DESCRIPTION OF THE PREFERRED EMBODIMENT

Figure 1:
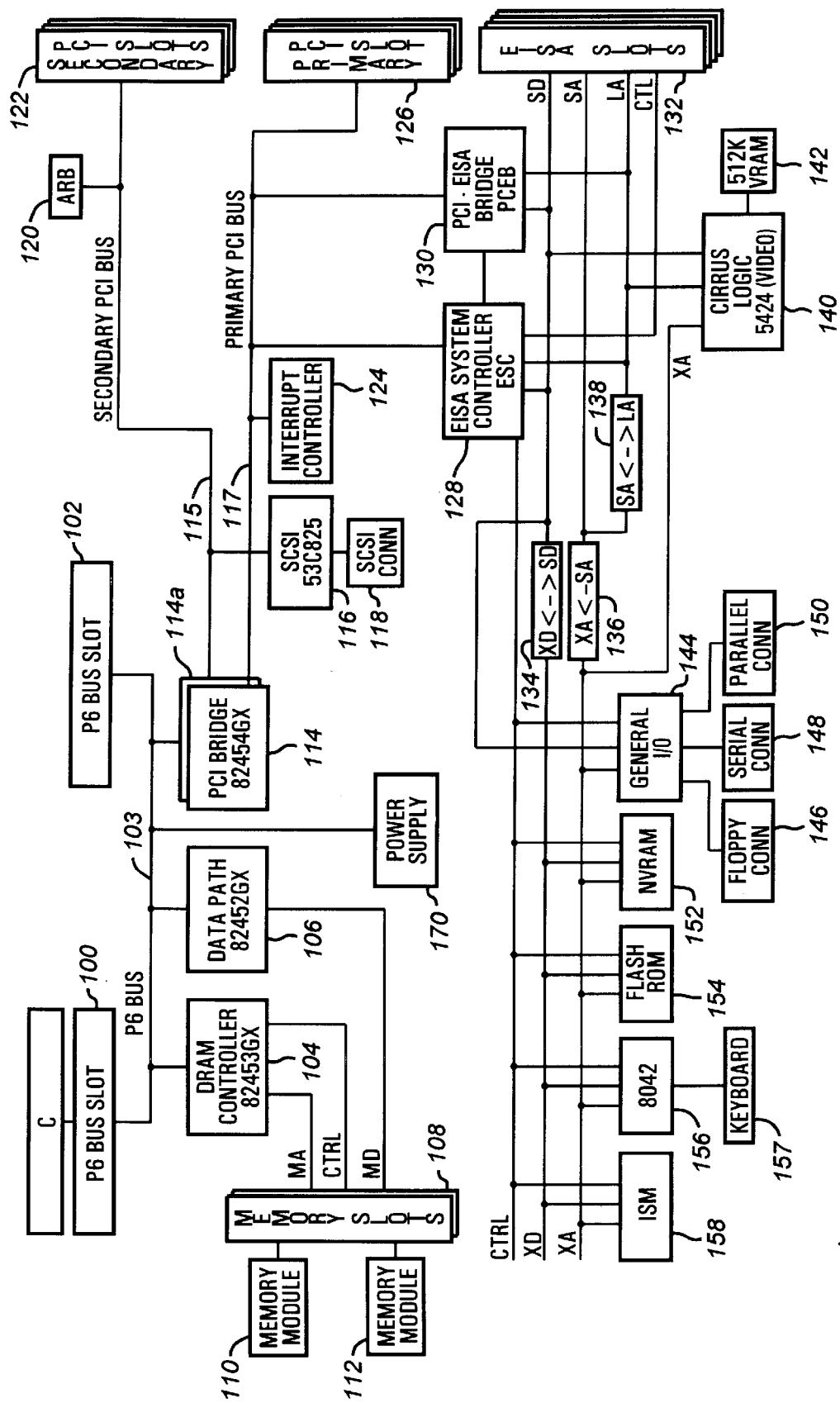
FIG. 1 is a schematic block diagram of a computer system having a replaceable card in accordance with the present invention.

Turning to FIG. 1, a server computer system S is disclosed. To provide sufficient processing capability for enterprise-class server applications, the server computer system S of FIG. 1 deploys one or more processors, preferably the Pentium Pro™ processor available from Intel Corporation located in Santa Clara, Calif. The Pentium Pro™ processors reside on a processor card C which is plugged into one of the P6 slots 100–102. The P6 slots 100–102 are connected to a 72-pin Pentium Pro™ host bus called the P6 bus 103. The P6 bus 103 is a high performance bus which preferably supports two processor cards mounted on slots 100–102. Preferably, each processor card C supports two Pentium Pro™ processors. Thus, the preferred embodiment supports up to four processors.

In addition to the processors, the P6 bus 103 is connected to a memory controller 104 and a data path device 106 which collectively form a DRAM control subsystem. Preferably, the DRAM controller is an 82453GX and the data path device 106 is an 82452GX both of which are available from Intel Corporation.

The DRAM controller 104 provides control and timing to the memory subsystem, while the data path device 106 interfaces the 72-bit P6 host bus to the memory array. The memory controller 104 and the data path 106 are capable of taking a memory request from the CPU, queuing it, and responding after the requested operation has completed. Additionally, the controller 104 provides memory error correction which is vital in server applications, including the capability of single-bit error correction and multi-bit error detection on the fly. The memory controller 104 can handle up to four gigabytes of page mode DRAM. Memory arrangements having non-interleaved, x2 and x4 interleaving configurations are supported by the memory control sub-system.

A plurality of memory modules 110–112 are connected to memory slots 108 to provide up to four gigabytes of memory. During operation, the actual performance of the memory subsystem will depend in part on the mix of read and write operations and the memory access patterns for a given application. The controller 104 minimizes the impact of the idle cycles by allowing read operations to bypass around the write operations and be completed first as long as the memory addresses for the read/write pair do not match.

In addition to the memory controllers, a robust input/output system is needed for the server S. The I/O subsystem designed for the server must be scalable while meeting the performance requirements for the four Pentium Pro™ processors. The PCI bus provides a combination of high performance and scalable I/O for the demanding environment faced in server applications. To provide PCI connections, one or more PCI bridges 114 are connected to the P6 bus 103. The peer-to-peer arrangement of the PCI bus eliminates one or more levels of arbitration present in the hierarchical arrangement, resulting in higher system performance.

Preferably, the PCI bridge 114 is an 82454GX PCI bridge (PB) from Intel which integrates the bus arbitration logic required to connect up to two 82454GX PB components without any external glue logic. In the preferred embodiment, one PCI bridge is configured to be the compatibility PCI bridge by strapping options at power-up. This PCI bridge provides the PC compatible path to the boot ROM and the EISA/ISA bus.

A second PCI bridge 114a, called an auxiliary bridge, is configured by strapping options to be the auxiliary PCI bridge. The auxiliary bridge 114a controlling the secondary PCI bus has an arbiter 120 which arbitrates accesses to the host after the compatibility bridge 114 has been serviced. Additionally, a system that requires more than two 82454GX PBs must provide an external arbiter.

Normally, the arbitration for the processor bus is controlled by the compatibility bridge, which will have a higher priority than the auxiliary bridge to ensure a proper response time for ISA bus masters. The plurality of PCI bridges 114 provides a plurality of PCI buses, which because of their direct connections to the P6 bus 103, provides inherently faster arbitration response tan the alternative of cascading PCI bridges together to provide for multiple PCI buses. This ability not only provides for design flexibility, but also for redundant I/O channels for systems in which reliability is paramount.

As in the DRAM controller 104, the PCI bridge 114 supports a full 64-bit interface to the CPU bus, including support for all protocols as well as error correction. The PCI bridge 114 supports an 8-deep transaction in-order queue as well as separate 4-deep queues for both outbound (processor to PCI) and inbound (PCI to processor) transactions that are for the I/O bus agent. Also, like the DRAM controller 104, the PCI bridge 114 provides four 32-byte data buffers in both the inbound and outbound directions. The buffers decouple the host bus 103 from the PCI buses 115–117 and optimize performance by allowing the posting of data at full bus speeds in both directions. However, unlike the DRAM controller 104, the PCI bridge 114 supports up to two outstanding deferred-reply requests. This feature allows a bus transaction to be split and completed later, preventing the Pentium Pro™ P6 bus 103 from becoming blocked by long latency I/O operations. In this mode, the PCI bridge 114 would defer Pentium Pro™ memory reads, I/O reads, I/O writes, and interrupt acknowledge transactions. However, memory write transactions are not deferred since they are better optimized through posting.

Attached to the secondary PCI bus 115 is a SCSI disk controller 116. The SCSI controller 116 provides the capability of handling simultaneous disk commands which is necessary in a multi-threaded, multi-tasking operating system. Preferably, the SCSI controller 116 is a 53C825 available from NCR Corporation. Attached to the 53C825 is one or more SCSI connectors 118 which drives a plurality of disk drives adapted to support the host system's simultaneous issuance of multiple commands to one or more SCSI devices. The ability to overlap commands and queue the commands to one or more devices can significantly boost performance in environments such as Windows 95 and NT. In addition to the SCSI controller 116, a plurality of devices may be plugged into the secondary PCI bus 115 over a plurality of secondary PCI slots 122.

On the PCI bus 117, an interrupt controller 124 handles interrupt requests coming into the PCI bridge 114 for eventual transmission to one of the processors in slots 100–102. The interrupt controller 124 routes interrupt requests from devices located on PCI buses 115–117 to the processors on slots 100–102 during multiprocessor operation. Additionally, a number of PCI peripherals may be plugged into a plurality of primary PCI slots 126.

An EISA system controller (ESC) 128, preferably the Intel 82374EB device, and a PCI-EISA bridge (PCEB) 130, preferably the Intel 82375EB, are also connected to the primary PCI bus 117. The ESC 128 and the PCEB 130 must be connected to the primary PCI bus 117, as the auxiliary bus controller must request arbitration from the compatibility bus controller 114 on some operations. That added latency means that the auxiliary bus or secondary PCI bus 115 cannot meet PCI version 2.1 latency specifications, and that EISA and ISA bus bridges have to be on the compatibility bus or primary PCI bus 117.

The ESC 128 and the PCEB 130 work in tandem to provide an EISA I/O subsystem interface for the computer system S. The combination of the ESC 128 and the PCEB 130 provides an I/O subsystem capable of taking advantage of the power of the PCI bus architecture while maintaining access to a large base of EISA and ISA expansion cards, and the corresponding software applications.

With the inclusion of the ESC 128 and the PCEB 130, the system S now contains three levels of buses structured in the following hierarchy: P6 bus 103 as the execution bus; an expansion bus system having a primary and secondary PCI bus 115–117; and EISA bus as a secondary I/O bus. This bus hierarchy allows concurrency for simultaneous operation on all three bus environments. Data buffering permits concurrency for operations that cross over into another bus environment. The ESC 128 implements system functions such as timer/counter, DMA, interrupt controller, and EISA subsystem control functions such as EISA bus controller and EISA bus arbiter. The PCEB 130 provides the interface to the bridge between the PCI and EISA buses by translating bus protocols in both directions. It uses extensive buffering on both the PCI and EISA interfaces to allow concurrent bus operations.

The ESC 128 and the PCEB 130 are connected to a plurality of EISA slots 132. Additionally, the ESC 128 also generates chip selects for certain functions that typically reside on an X bus. The ESC 128 generates chip select signals from an integrated system management unit (ISM) 158, a keyboard controller 156, a flash ROM 154, a non-volatile RAM 152, and a general purpose I/O device 144 which supports floppy drives, serial ports, and parallel ports over floppy connectors 146, serial connectors 148, and parallel connectors 150.

The EISA slots 132 have system data lines connected to the data bus of the X bus via a buffer 134 which provides accesses to I/O devices as well as the system BIOS in the flash ROM 154. Further, the EISA slots 132 have system address lines that are connected to the address lines of the X bus via buffer 136. The EISA slots 132 have latched address lines which are connected to the system address lines via buffer 138. Finally, a video controller 140 is connected to the X bus address lines, the EISA/132 system data lines, and the latched address lines. Preferably, the video controller is a Cirrus Logic 5424 controller. The video controller 140 is connected to a video RAM 142 which is preferably 512 kilobytes in size.

Further, all electronic devices, including the processors, are powered by a regulated power supply 170. The power supply 170 receives a shutdown signal formed by the apparatus of the present invention to prevent the application of power to the entire computer system S in the event that one or more cards are improperly inserted in the slots. As described below, if one of the electrically-keyed cards C is improperly inserted into its slot, the power supply 170 is shutdown to prevent possible damage to the computer system S.

Figure 2:
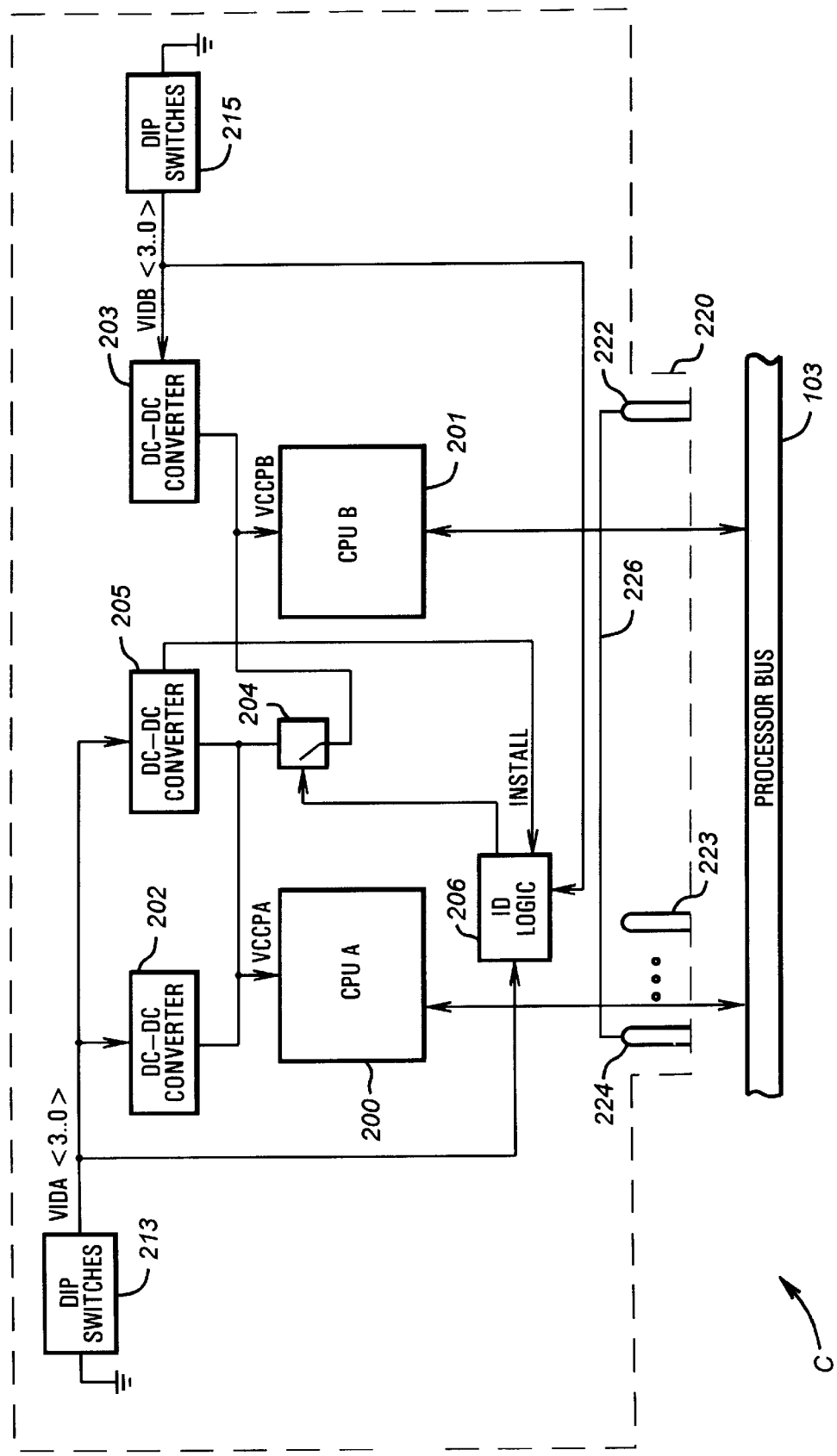
FIG. 2 is a schematic block diagram of the replaceable card of the computer system of FIG. 1.

Turning to FIG. 2, more detail is provided on the processor card C which can be inserted into either slot 100 or slot 102. In FIG. 2, the processor card C has a first CPU 200 and a second CPU 201. The CPU 200 is powered by a DC—DC converter 202, while the CPU 201 is powered by a DC—DC converter 203. The voltage generated by the DC—DC converter 202 is specified via a plurality of DIP switches 213. Similarly, a plurality of DIP switches 215 are provided to specify the voltage to be generated by the DC—DC converter 203. The DC—DC converters 202–203 provide power to the respective CPUs 200–201. Additionally, a redundant DC—DC converter 205 is available. The output voltage on the DC—DC converter 205 is also specified by DIP switches 213.

In one mode of operation where the CPU 200 is the primary CPU, the DC converters 202 and 205 provide power to the CPU 200, while the DC—DC converter 203 solely powers the CPU 201. If the setting of DIP switches 213 and 215 is equal in value, the DC—DC converter 205 can be set up so that it powers both CPUs 200–201. This comparison is provided by an ID logic 206 which receives inputs from DIP switches 213–215 and receives an install signal from the DC—DC converter 205. If the setting of DIP switches 213–215 is equal and the DC—DC converter 205 is installed, the DC—DC converter 205 provides power to both CPUs 200–201. Although the preferred embodiment uses DIP switches 213 and 215, it is known by those skilled in the art to have the CPUs 200–201 generate and present the voltage request signals directly to the DC—DC converters 202, 203 and 205 in place of the DIP switches 213 and 215.

Each of CPUs 200–201 can operate in parallel for applications that can take advantage of parallel processing. In addition to being able to operate in parallel, the dual processor configuration and the processor card C on slot 100 can operate in a functional redundancy check (FRC) mode to provide additional reliability checking. The FRC mode configuration consists of one master CPU and one slave or checker CPU. The two CPUs are connected as one logical unit. The master runs code and produces results. Meanwhile, the slave runs the same code and compares its results with the master's results. If there is any disagreement, an error is registered. The two CPUs 200–201 are maintained in lock-step by synchronizing all of their inputs to the clock of the CPU board.

In the preferred embodiment, the Pentium Pro™ provides the FRC mode logic. All of the inputs and most of the outputs of the FRC pair 200–201 are tied directly together. One processor is configured as master or checker during system reset. The processor configured as the master behaves as a normal processor. The processor configured as the checker never drives its outputs, but compares them to the outputs of its master. If a discrepancy arises, the checker signals the master by asserting FRCERR for one clock cycle. After the assertion of FRCERR, the checker stops further checking and its internal state is undefined. Upon receiving FRCERR, the master FRC CPU appropriately jumps to an error handling routine so that it can recover from the error.

Upon installation, CPUs 200–201 on card C are connected to the processor bus 103 via a plurality of fingers 223 located on a card edge 220 adapted to be received by connector contacts on slots 100–102 so that the CPUs 200–201 of card C are electrically connected to the rest of the server computer S. Particularly, key fingers 222 and 224 in the card edge 220 of card C are electrically connected to each other via a conductor 226 to form an electrical key which, as discussed below, ensures that the cards are properly inserted before unlocking the power supply 170 and allows power to be provided to the rest of the computer system S.

Figure 3:
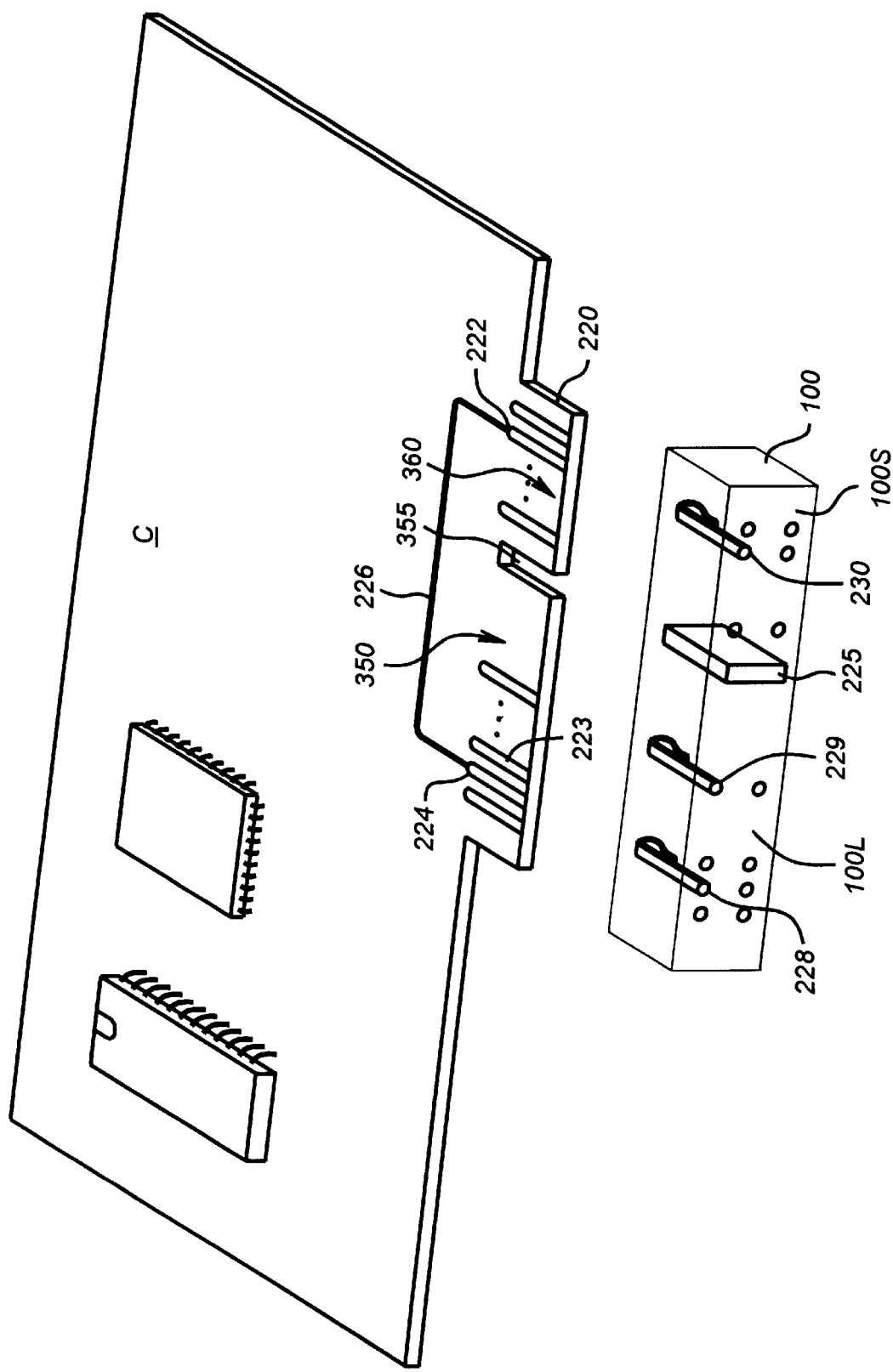
FIG. 3 is a partially exploded isometric view showing the relationship between the card of FIG. 2 and the computer slot of FIG. 1.

The invention is illustrated in more detail in FIG. 3. As shown in FIG. 3, the circuit card C has a card edge 220. The card edge 220 has asymmetrical card edge segments 350 and 360 separated by a notch 355 which forms a mechanical key for ensuring proper orientation of the circuit card C on the slot 100. As is conventional, the card C has on its card edge 220 one or more electrically conductive fingers 223 for connecting with corresponding contacts in the slot 100. The number of conventional fingers 223 on card edge 220 depends on the particular type and nature of the card C. Since this is a conventional feature, a number of such fingers are not shown in the drawings to preserve clarity.

In addition to the conventional card edge fingers 223, mounted on the card edge 220 are a pair of spaced, interconnected conductive card edge fingers 222 and 224. The conductive fingers 222 and 224 serve as a portion of an insertion detector circuit and are electrically connected to each other by a conductor 226 suitably formed in or on the circuit card C. In the preferred embodiment, key fingers 222 and 224 are located on separate card edge segments 350 and 360 so that the key fingers 222 and 224 are physically spaced apart from each other along the card edge 220. The spatial separation of the key fingers 222 and 224 is typically a substantial part of the lateral extent of the portion of card edge 220 which is fitted into the slot 100.

The spatial separation between fingers 222 and 224 is important, for if the fingers 222 and 224 were located adjacent to each other, fingers 222 and 224 can be electrically connected even though the card C was only partially inserted into its slot 100. In contrast, when fingers 222 and 224 are separated, the fingers can only engage with and make electrical connections with the connector contacts of the slot 100 when the card edge 220 and the other electrical fingers on it are properly inserted in the slot 100. Thus, when the circuit card C is properly seated in the slot 100, fingers 222 and 224 complete a portion of the insertion detector circuit.

Turning now to the slot 100, the slot 100 has a divider 225 which is adapted to be fitted into the notch 355 of the card edge 220 upon the insertion of the card C into the slot 100. The divider 225 thus compartmentalizes the slot 100 into asymmetrical receptacles 100L and 100S which are adapted to receive corresponding asymmetrical card edges 350 and 360 of the card C. The notch 355, the asymmetrical edges 350 and 360, and the divider 225 thus provide a mechanical key for making sure that only a properly oriented circuit card C can be plugged into one of slots 100–102. Although an asymmetrical card edge/slot combination is disclosed, one skilled in the art would know of equivalent ways for shaping, sizing, and positioning the circuit card assembly on the connector so that each card will only fit into its connector in one specific manner of proper alignment and positioning. For instance, a card edge protrusion, along with a corresponding groove on the connector for the slot 100, could be used in place of the notch 355 and divider 225 to ensure the proper insertion of the card C.

As further shown in FIG. 3, the slot 100 provides a plurality of spaced contacts 229 and 230 which are adapted to respectively engage the fingers 222 and 224, respectively. Properly aligned insertion of the card C into the slot 100 completes a series electrical path through the conductor 226 on the card C between key contacts 228 and 230, as has been set forth. The key fingers 222 and 224 and the key contacts 228 and 230 thus form a portion of an insertion detector circuit to ensure that the circuit card C is properly oriented and fully inserted into the slot 100 before allowing the computer system S to power-up.

Figure 4:
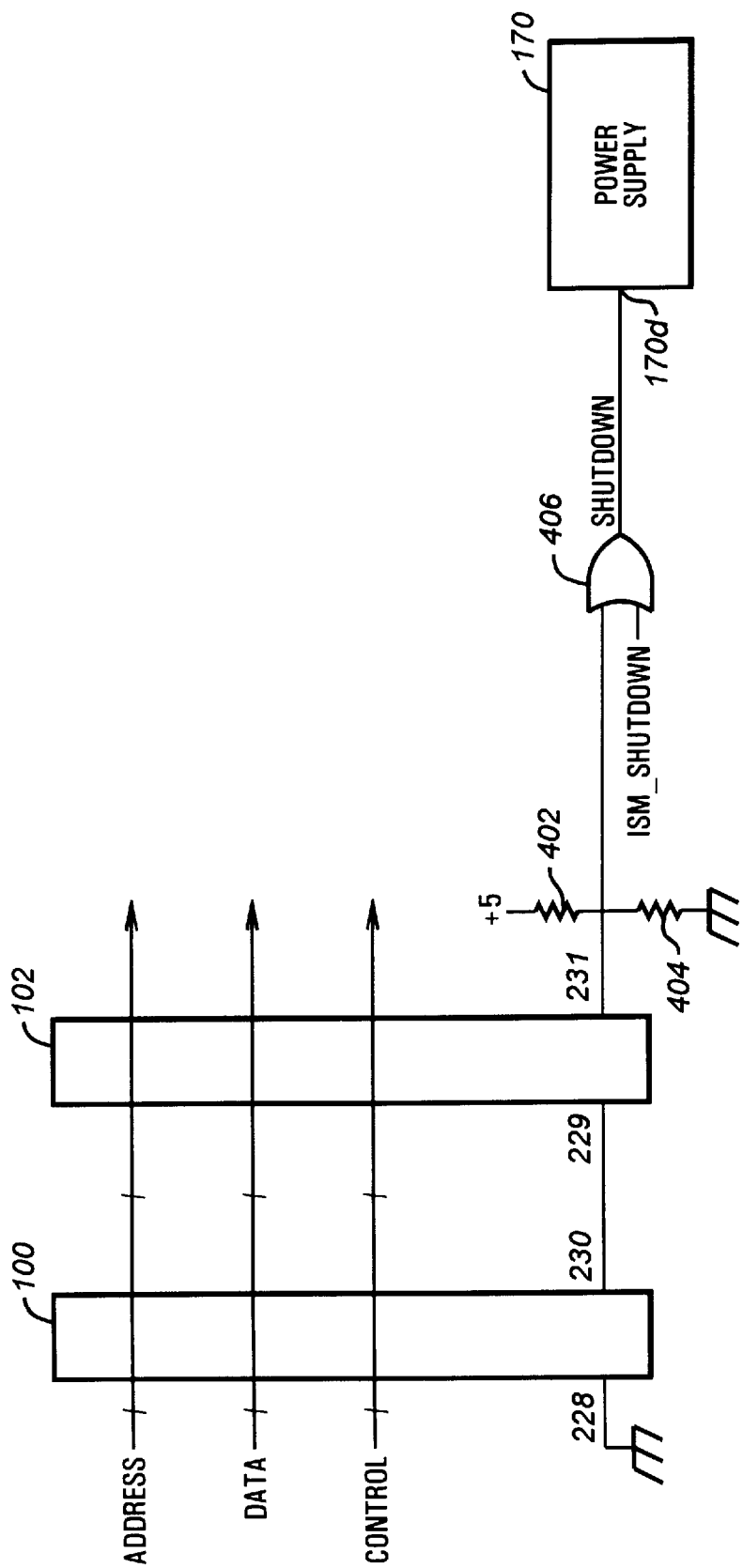

FIG. 4 illustrates the insertion detector circuit of the present invention in more detail for protecting a computer system having a set of two slots 100 and 102. A key contact 230 of the first slot 100 is connected in a series circuit to key contact 229 on the second slot 102. Upon proper insertion of a card C into each of the respective slots 100 and 102, a series circuit connection is formed from the key contact 228 on the slot 100 through the cards C via their respective key fingers 222 and 224 to the key contact 231 of the slot 102. When this circuit is completed, the insertion detector circuit of the present invention allows the computer system S to power-up.

In the event that only one card C is used in a computer system having two slots, a dummy card having no components other than the spaced electrically connected key fingers 222 and 224 can be used. The dummy card is plugged into the slot which is not used to complete the insertion detector circuit through the unused slot. Thus, upon a proper insertion of the dummy card into an unused slot in the set of slots 100–102, the series connection for proper card insertion detection between the slots 100 and 102 can still be completed. In this manner, the computer system S needing only one card but having two card slots can power up with one properly inserted electronic card C and one properly inserted dummy card in a two slot system.

As shown in Fire 4, in the insertion detector circuit, the key contact 228 of the first slot 100 is connected to a known reference potential or voltage, preferably ground. The second key contact 230 is connected to the first key contact 229 of the second slot 102. The second key contact 231 of the second slot 102 is in turn connected to the first key contact of the subsequent slot. Thus, upon the complete engagement of the cards onto the slots, all key contacts 228, 229, 230 and 231 are connected in a series electrical circuit arrangement as part of the insertion detector circuit.

The output of the final key contact 231 in the slot 102 is connected to a power inhibitor circuit which turns on the power supply only when the voltage present at the contact of the last card slot equals the known voltage applied to the key contact 228 of the first slot. This is an electrical indication that all circuit cards are properly aligned and fully seated in their respective card slots. The power inhibitor circuit of FIG. 4 is adapted to bias a disable input 170d of the power supply 170 and to thus inhibit operation of the power supply 170 unless the card C is properly inserted.

The power inhibitor circuit has a pull-up resistor 402 as part of a bias circuit connected to a supply voltage and a pull-down resistor 404 connected to ground. The output of the bias circuit formed at a junction between resistors 402 and 404 is connected to the second key contact 231 of the second slot 102. In the event that cards C are properly inserted in the slots 100 and 102, a completed series circuit path is formed, as set forth above, from the key contact 228 of the slot 100 to the key contact 231 of the slot 102. As the key contact 228 is connected to ground, the junction of resistors 402 and 404 in the bias circuit is forced or pulled to the electrical ground.

The power inhibit circuit of FIG. 4 also includes an OR gate 406 connected at one input terminal to the junction of resistors 402 and 404. The OR gate 406 also has another input terminal which receives an ISM shut-down signal, usually indicative of a major system operating problem, from the ISM 158 of FIG. 1. The ISM shut-down signal is an output generated by the ISM device 158 which requests power supply shut-down for a variety of reasons, including overheating, short circuit and the like. The output of the OR gate 406 is a SHUTDOWN signal which is provided to the disable input 170d of the power supply 170 to turn off the power supply in the event of misinsertions of the cards on the slots 100–102, or in the event that the ISM 158 requests the power supply be shut-down.

Figure 5:
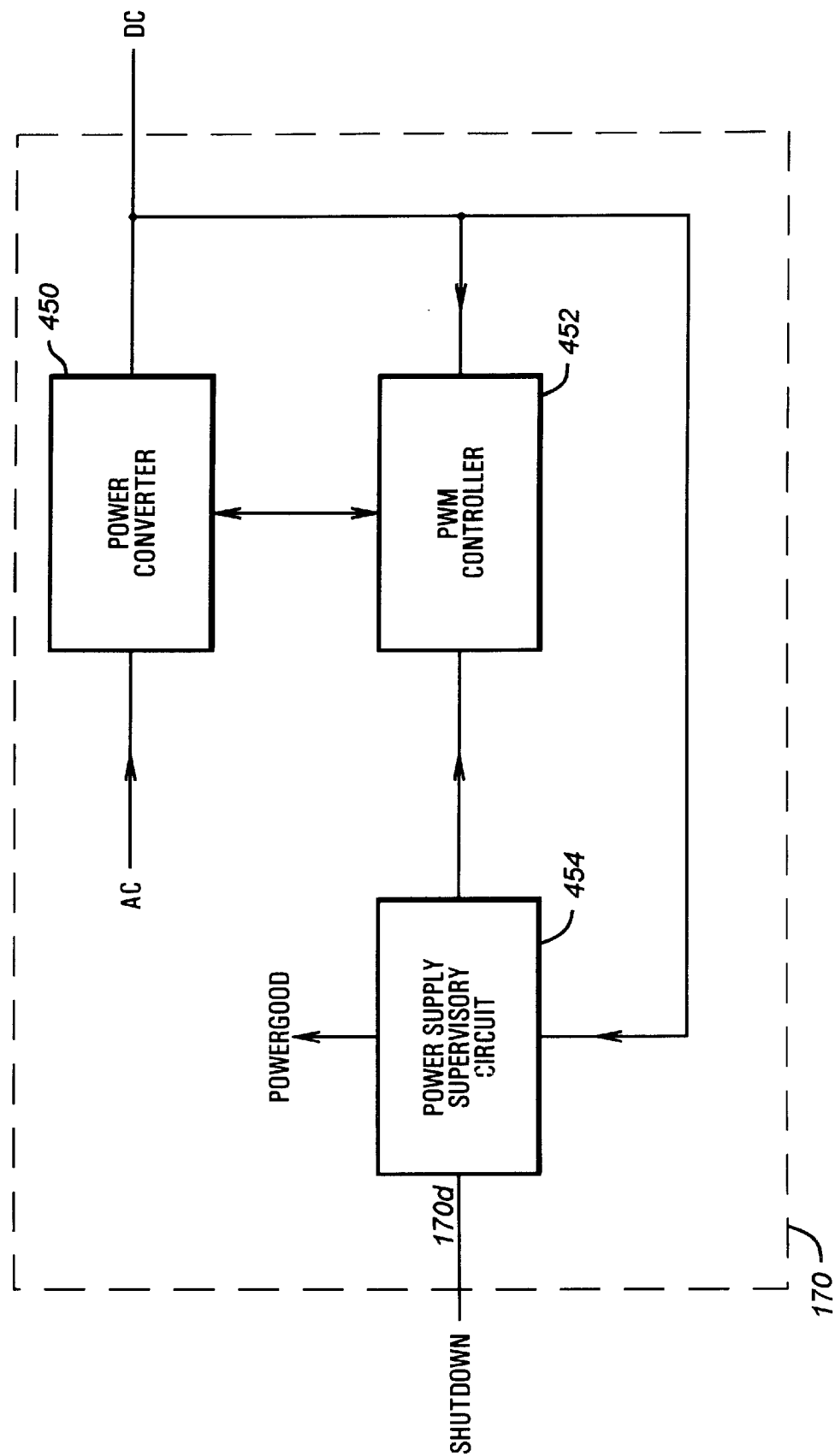
FIG. 5 is a block diagram of the power supply unit for the computer system of FIG. 1.

The circuitry of the regulated power supply 170 (FIG. 5) includes, as is conventional, a power converter 450 for converting an AC voltage to one or more DC voltages. The power converter 450 preferably has a pair of input power terminals connected to a single-phase AC input power source. As is well-known in the art, the AC terminals are coupled across a bridge rectifier arrangement which develops a high DC voltage across a filter capacitor. This high DC voltage is connected to the input of a power supply controller 452 that includes a pulse width modulator (PWM) for converting the high DC input voltage to a low DC output voltage. The output of the power converter 450 is also connected to a power supply supervisory circuit 454 which generates various output signals indicating the state of the power supply, including a POWERGOOD signal. The power supply supervisory circuit 454 also receives the shutdown signal input SHUTDOWN from the gate 406 of the power inhibitor circuit to disable the power supply 170. As has been disclosed, gate 406 forms a SHUTDOWN signal when one or more of the cards C is not properly inserted, or on receipt of a system error signal from the ISM 158 due to an over-voltage, over-current, or under-voltage fault.

The PWM controller 452 operates as a fixed frequency current mode controller where the duty cycle is set by the input/output voltage ratio. The PWM controller 452 has an enable/disable input signal, driven by SHUTDOWN from supervisory circuit 454. Thus, the pulse width modulator 452 can be disabled to shutdown the power supply.

The apparatus of the present invention ensures that circuit cards of a computer system are properly oriented and fully inserted into their slots before allowing the computer system to power-up. The use of asymmetrical card edges forms a mechanical key for ensuring proper orientation of the circuit card on the slot. Further, the use of key fingers on the card edge, slot contacts adapted to engage the two key fingers, and the series connection between the slots provides an effective method of detecting when all cards have been fully seated on the slots. Upon a complete engagement of the cards onto the slots, all contacts are connected in a series arrangement, with the final contact connected to a part of the insertion detector circuit. This turns on the power supply only when each of the cards C is properly inserted.

The prompt shutdown of the power supply 170 due to an incorrect insertion of the circuit cards detected during power up provides significant improvements in the protection of sensitive system components. In particular, the electronic key of the present invention shields sensitive and expensive integrated circuits from damage due to incorrect card insertions. In addition, the electronic key prevents damage to other components by excessive currents drawn if a short circuit condition exists due to incorrect card insertions. In all instances, a rapid power supply shutdown reduces the risk of damage to either the card or the computer system due to circuit card misinsertions.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

I claim:

1. An apparatus for protecting a computer system which has a power supply from damage during start-up as a result of incorrect circuit card insertions, said apparatus comprising:

a circuit card having at least two card edge segments on an edge thereof;

said card edge segments being spaced from each other;

said card edge segments being of different widths;

each said card edge segment having a conductive electrical finger thereon;

said electrical fingers being electrically connected to each other;

a card slot for receiving said circuit card, said card slot having a pair of connector contacts adapted to engage and make electrical contacts with said electrical fingers when said circuit card is properly seated in said card slot;

a power inhibit circuit for inhibiting operation of the computer power supply; and an insertion detector for detecting the seating status of said card in said card slot, said insertion detector activating said power inhibit circuit unless said card is properly inserted to protect the computer system against damage.

2. The apparatus of claim 1, wherein the distance between said electrical fingers is sufficient to complete an electrical path between said connector contacts only when said card is properly seated in said card slot.

3. The apparatus of claim 1, wherein said fingers are spaced from each other on said card edge at a distance such that when said fingers are engaged and in contact with said connector contacts, said circuit card is properly seated in said card slot.

4. The apparatus of claim 1, wherein said insertion detector completes an electrical path between said connector contacts when said circuit card is properly seated in said card slot.

5. The apparatus of claim 1, wherein said power supply has a disable input for inhibiting said power supply, said power inhibit circuit further comprises an OR gate having a first input electrically connected to one of said connector contacts and a second input for receiving an external shut-down signal, said OR gate having an output electrically connected to said power supply disable input.

6. The apparatus of claim 5, wherein said power supply inhibit circuit further comprises a bias source for said disable input to inhibit said power supply unless said card is properly inserted.

7. The apparatus of claim 1, further comprising:

a second circuit card also having a pair of spaced apart fingers electrically connected to each other;

a second card slot for receiving said second circuit card, said second card slot having a pair of corresponding connector contacts adapted to engage and make electrical contacts with said pair of spaced apart fingers on said second circuit card when said second circuit card is properly seated in said second card slot, said first and second card slots being electrically connected together.

8. A computer system with safeguards against damage caused by improper card insertions, comprising:

a power supply for providing power to the computer system;

a circuit card having at least two card edge segments on an edge thereof;

said card edge segments being spaced from each other;

said card edge segments being of different widths;

each said card edge segment having a conductive electrical finger thereon;

said electrical fingers being electrically connected to each other;

a card slot for receiving said circuit card, said card slot having a pair of connector contacts adapted to engage and make electrical contacts with said electrical fingers when said circuit card is properly seated in said card slot;

a power inhibit circuit for inhibiting operation of the computer power supply; and an insertion detector for detecting the seating status of said card in said card slot, said insertion detector activating said power inhibit circuit unless said card is properly inserted to protect the computer system against damage.

9. The computer system of claim 8, wherein the distance between said electrical fingers is sufficient to complete an electrical path between said spaced apart contacts only when said card is properly seated in said card slot.

10. The computer system of claim 8, wherein said fingers are spaced from each other on said card edge at a distance such that when said fingers are engaged and in contact with said connector contacts, said circuit card is properly seated in said card slot.

11. The computer system of claim 8, wherein said insertion detector completes an electrical path between said connector contacts when said circuit card is properly seated in said card slot.

12. The computer system of claim 8, wherein said power supply has a disable input for inhibiting said power supply, said power inhibit circuit further comprises an OR gate having a first input electrically connected to one of said connector contacts and a second input for receiving an external shutdown signal, said OR gate having an output electrically connected to said power supply disable input.

13. The computer system of claim 12, wherein said power supply inhibit circuit further comprises a bias source for said disable input to inhibit said power supply unless said card is properly inserted.

14. The computer system of claim 8, further comprising:

a second circuit card also having a pair of spaced apart fingers electrically connected to each other;

a second card slot for receiving said second circuit card, said second card slot having a pair of corresponding connector contacts adapted to engage and make electrical contact with said pair of spaced apart fingers on said second circuit card when said second circuit card is properly seated in said second card slot, said first and second card slots being electrically connected together.

15. A circuit card which protects a computer system from damage during start-up as a result of incorrect circuit card insertions, said circuit card adapted for insertion into a computer system having a card slot with a pair of spaced apart connector contacts adapted to engage said circuit card, a power supply, a power inhibit circuit for inhibiting operation of the computer power supply, and an insertion detector for detecting the seating status of said circuit card in said card slot, said circuit card comprising:

a circuit card base;

at least two card edge segments on an edge thereof;

said card edge segments being spaced from each other;

said card edge segments being of different widths;

each said card edge segment having a conductive electrical finger thereon;

said electrical fingers being electrically connected to each other; and a conductor coupled between said electrical fingers for providing an electrical path between said electrical fingers, said conductor adapted to complete an electrical path in said power inhibit circuit and to deactivate said power inhibit circuit only when said card is properly inserted to protect the computer system against damage.

16. The circuit card of claim 15, wherein the distance between said electrical fingers is sufficient to complete an electrical path between said connector contacts only when said card is properly seated in said card slot.

17. The circuit card of claim 15, wherein said fingers are spaced from each other on said side edges at a distance such that when said fingers are engaged and in contact with said connector contacts, said circuit card is properly seated in said card slot.

* * * * *